United States Patent [19]

Chang

[11] Patent Number: 5,666,307
[45] Date of Patent: Sep. 9, 1997

[54] PMOS FLASH MEMORY CELL CAPABLE OF MULTI-LEVEL THRESHOLD VOLTAGE STORAGE

[75] Inventor: Shang-De Ted Chang, Fremont, Calif.

[73] Assignee: Programmable Microelectronics Corporation, San Jose, Calif.

[21] Appl. No.: 557,514

[22] Filed: Nov. 14, 1995

[51] Int. Cl.[6] .................................................. G11C 11/34
[52] U.S. Cl. ........................... 365/185.03; 365/185.19; 365/185.26; 365/185.33
[58] Field of Search .................... 365/185.03, 185.19, 365/185.24, 185.26, 185.29, 185.33, 218; 257/322

[56] References Cited

U.S. PATENT DOCUMENTS

| | | | |
|---|---|---|---|
| 4,435,790 | 3/1984 | Tickle et al. ........................ | 365/218 |
| 4,816,883 | 3/1989 | Baldi ................................... | 257/322 |
| 5,487,033 | 1/1996 | Keeney et al. ...................... | 365/185.19 |
| 5,539,688 | 7/1996 | Yiu et al. ............................ | 365/185.29 |

OTHER PUBLICATIONS

Masanori Kikuchi, Shuichi Ohya and Machio Yamagishi, *A New Technique to Minimize the EPROM Cell*, IC Division, Nippon Electric Company, Ltd., 1753, Shimonumabe, Kawasaki, Japan, pp. 181–182.

Dov Frohman–Bentchkowsky, INTEL Corporation, Santa Clara, California, *FAMOS—A New Semiconductor Charge Storage Device*, Solid State Electronics 1974, vol. 17 pp. 517–529.

Constantine A. Neugebauer and James F. Burgess, General Electric Corporation, *Session XV: Programmable Read–Only Memories*, Feb. 18, 1977, pp. 184 and 185.

S. Baba, A. Kita and J. Ueda, *Mechanism of Hot Carrier Induced Degradation in MOSFET's*, VLSI R&D Center, Oki Electric Industry Co., Ltd., 1986, pp. 734–737.

*Primary Examiner*—David C. Nelms
*Assistant Examiner*—Trong Quang Phan
*Attorney, Agent, or Firm*—Flehr Hohbach Test Albritton & Herbert LLP; William L. Paradice, III

[57] ABSTRACT

A P-channel flash EEPROM cell has P+ source and P+ drain regions, and a channel extending therebetween, formed in an N-type well. A thin layer of tunnel oxide is provided over the channel. A poly-silicon floating gate and poly-silicon control gate, separated by a dielectric layer, overlie the tunnel oxide. Programming is accomplished via hot electron injection while erasing is realized by electron tunneling. The threshold voltage of the cell may be precisely controlled by the magnitude of voltage coupled to the floating gate during programming. Since the injection of hot electrons into the floating gate is independent of variations in the thickness of the tunnel oxide layer and the coupling ratio between the floating gate and the control gate, programming operations and data retention are not affected by process variations. In addition, PMOS devices conduct a gate current via hot electron injection over a narrow range of gate voltages, thereby allowing for precise control over the gate current and thus over the charging of the floating gate. This control over the gate current, as well as the independence of the cell's threshold voltage of process parameters, advantageously allows the threshold voltage of the cell to be more accurately controlled, thereby resulting in a more reliable cell capable of storing a greater number of bits of data.

14 Claims, 3 Drawing Sheets

5,666,307

PMOS FLASH MEMORY CELL CAPABLE OF MULTI-LEVEL THRESHOLD VOLTAGE STORAGE

CROSS REFERENCE TO RELATED APPLICATIONS

This application is related to the U.S. patent application Ser. No. 08/557,589 entitled "A PMOS Memory Cell with Hot Electron Injection Programming and Tunnelling Erasing", U.S. patent application Ser. No. 08/557,442 entitled "Non-volatile Electrically Erasable Memory with PMOS Transistor NAND Gate Structure", both filed on Nov. 14, 1995, and U.S. patent application Ser. No. 08/560,249 entitled "PMOS Flash EEPROM Cell with Single Poly", filed on Nov. 21, 1995.

BACKGROUND OF THE INVENTION

FIG. 1 shows a conventional EEPROM cell 10 in which more than two binary states may be represented by programming cell 10's threshold voltage to one of many predetermined levels. When cell 10 is read, the current level conducted therein is dependent upon the threshold voltage thereof.

Cell 10 includes a storage transistor 12 and a select transistor 14 formed in a P− substrate 16. N+ diffusion region 18 serves as the source of storage transistor 12, N+ diffusion region 20 serves as the drain of storage transistor 12 as well as the source for select transistor 14, and N+ diffusion region 22 serves as the drain of select transistor 14. A bit line BL of an associated memory array (not shown) is coupled to drain 22 of select transistor 14. A high impedance resistor 32 is coupled between drain 22 of select transistor 14 and ground potential. A voltage sensing circuit 34 coupled to drain 22 measures the voltage at drain 22 to determine the threshold voltage $V_t$, and thus the multiple-bit data stored in cell 10. Storage transistor 12 has a floating gate 24 and a control gate 26, and select transistor 14 has a select gate 28. A tunnel window (not shown) is formed within tunnel oxide 30 layer to facilitate electron tunneling between floating gate 24 and drain 20.

Floating gate 24 is charged by applying an erase voltage $V_e$ between 16–20 V to control gate 26 and 16–20 V to select gate 26 and 0 V is applied to bit line BL and source 18. Electrons tunnel from drain 20 to floating gate 24, thereby increasing the threshold voltage $V_t$ of storage transistor 12.

Cell 10 may be programmed by applying a program voltage $V_p$ between 13–20 V to bit line BL and select gate 28 while control gate 26 is grounded and source 18 is in a high impedance state. The resultant electric field causes electrons to tunnel from floating gate 24 to drain 20, thereby discharging floating gate 24 and decreasing the threshold voltage $V_t$ of cell 10. The resultant $V_t$ of storage transistor 12, and thus the current conducted by cell 10 during a read operation, may by controlled by adjusting the program voltage $V_p$.

Accordingly, more than one bit of information may be stored in cell 10 by altering the threshold voltage $V_t$ of cell 10 to one of many possible values. Typically, the threshold voltage of cell 10 is approximately 0 V in its uncharged state and approximately −2 V and 4 V in its fully positive and negative charged states, respectively. The range of $V_t$ for multi-level applications is approximately 2.5 V. However, variations in the thickness of the tunneling oxide layer 30, as well as the coupling ratio between floating gate 24 and control gate 26, make it difficult to manipulate the threshold voltage $V_t$ of storage transistor 12. Moreover, cell 10 suffers from read disturb problems which may adversely affect the reliability of cell 10. Further, the relatively high voltages across the P/N junctions within cell 10 during erasing and programming undesirably limit the extent to which the size of cell 10 may be reduced.

It would thus be desirable for a flash EEPROM cell in which the threshold voltage $V_t$ may be controlled independently of process variations. It would be desirable for a flash EEPROM cell that not only uses low programming and erasing voltages but also is immune from read disturb problems.

SUMMARY OF THE INVENTION

A memory cell having multi-level programming is disclosed herein which overcomes problems in the art described above. In accordance with the present invention, a P-channel flash EEPROM cell has P+ source and P+ drain regions, and a channel extending therebetween, formed in an N-type well. A thin layer of tunnel oxide is provided over the channel and, in some embodiments, over significant portions of P+ source and P+ drain regions. A poly-silicon floating gate and poly-silicon control gate, separated by a dielectric layer, overlie the tunnel oxide. Programming is accomplished by coupling a sufficient voltage to the floating gate via the control gate while biasing the source and drain regions to cause the injection of hot electrons from the N-well/drain junction to the floating gate, while erasing is realized by biasing the floating gate, N-well, source and drain regions appropriately so as cause the tunneling of electrons from the floating gate to the N-well, the source, and the drain.

The threshold voltage of the memory cell may be precisely controlled by the magnitude of voltage coupled to the floating gate during programming. The injection of hot electrons into the floating gate, affected only by the voltage applied to the control gate, is independent of variations in the thickness of the tunnel oxide layer and the coupling ratio between the floating gate and the control gate. Further, PMOS devices conduct a gate current via hot electron injection over a narrow range of gate voltages, thereby allowing for precise control over the gate current and thus over the charging of the floating gate. This control over the gate current, as well as the lack of dependence of the cell's threshold voltage upon process parameters, advantageously allows the threshold voltage of the cell to be more accurately controlled than that of conventional N-channel EEPROM cells such as cell 10 of FIG. 1, thereby resulting in a more reliable cell capable of storing a greater number of bits of data.

DETAILED DESCRIPTION OF THE PREFERRED EMBODIMENTS

Figure 2:
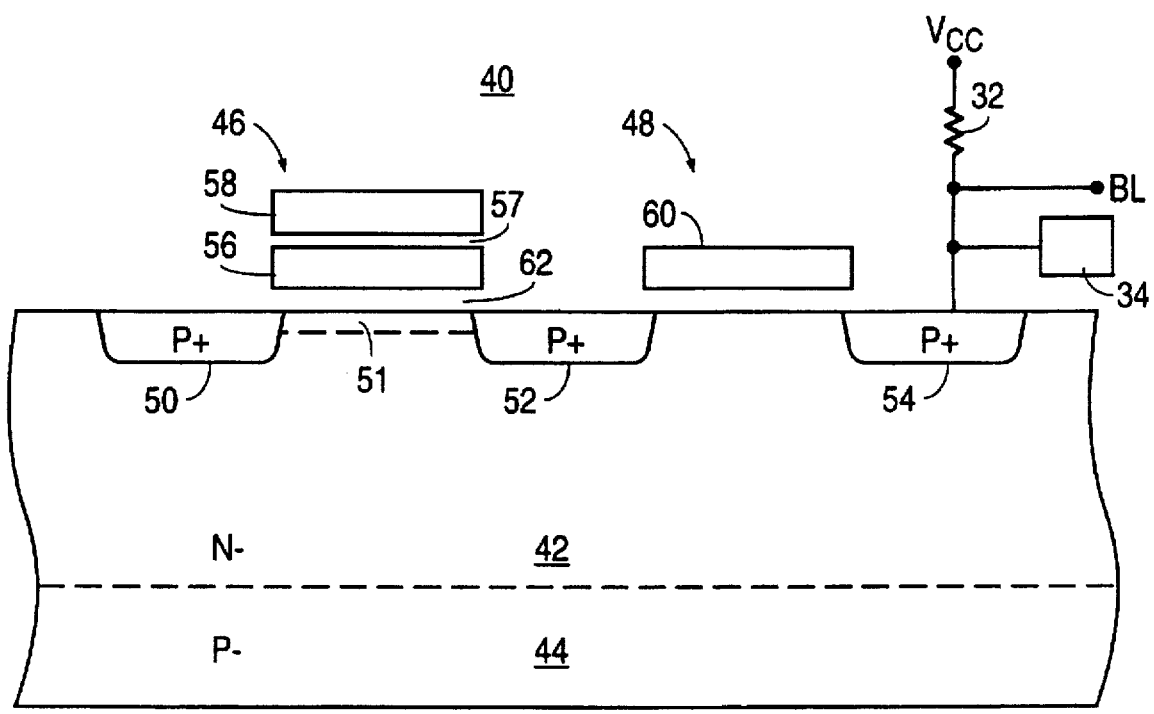
FIG. 2 is a cross-sectional view of a multi-level threshold voltage cell in accordance with the present invention.

FIG. 2 shows PMOS EEPROM cell 40 which, in accordance with the present invention, is capable of storing numerous bits of binary data. Cell 40 is formed in an N-well 42 provided within a P– substrate 44 and includes a P-channel MOS stacked gate storage transistor 46 and a P-channel MOS select transistor 48. P+ diffusion region 50 serves as the source of storage transistor 46, P+ diffusion region 52 serves as the drain of storage transistor 46 and the source of select transistor 48, and P+ diffusion region 54 serves as the drain of select transistor 48. A bit line BL is coupled to drain 54 of select transistor 48. Storage transistor 46 has a floating gate 56 and a control gate 58, and select transistor 48 has a select gate 60. A layer of tunnel oxide 62 approximately 80–130 Å thick is provided between floating gate 56 and the surface of N-well 42. In one embodiment, oxide layer 62 extends over the entire length of channel 51 and substantial portions of P+ source 50 and P+ drain 52 of storage transistor 46. A dielectric layer 57 approximately 180–350 Å thick is provided between floating gate 56 and control gate 58. Note that although shown in the context of CMOS fabrication technology, cell 40 may be fabricated using PMOS technology.

To program cell 40, approximately 8 V is applied to P+ source 50 and N– well 42 while bit line BL and select gate 60 are held at ground potential. When a program voltage $V_p$ is applied to control gate 58, positively charged holes are attracted to the less positive voltage on P+ drain 52 and accelerate through channel region 51 towards P+ drain 52. These holes collide with electrons in the drain depletion region proximate the drain 52/N-well 42 junction, thereby resulting in impact ionization. The high energy electrons generated from impact ionization are attracted by the positive voltage on control gate 58 and are injected from the depletion region into floating gate 56. The resultant negative charge on floating gate 22 depletes channel region 51 and increases the threshold voltage $V_t$ of cell 40 in the positive direction. In its natural state, cell 40 has a threshold voltage $V_t$ between approximately –3 and –6 V and when fully charged has a threshold voltage $V_t$ of approximately 3 V. During normal operation of cell 40's host chip (not shown), cell 40 may be programmed so as to have a $V_t$ between approximately –5 V and +1 V, thereby allowing a range of approximately 6 V for the threshold voltage $V_t$.

In one embodiment, the program voltage $V_p$ may be between 5–15 V, depending upon the predetermined threshold voltage $V_t$ of cell 40. In another embodiment, the program voltage $V_p$ may be a ramped voltage from $V_{cc}$ to approximately 15 V.

To erase cell 40, an erase voltage $V_e$ between 15–22 V is applied to P+ source 50, N– well 42, and select gate 60 while control gate 26 is grounded (bit line BL is floating). Electrons tunnel from floating gate 56 through the entire length of tunneling oxide layer 62 into channel 51, source 50, and drain 52, thereby rendering the threshold voltage $V_t$ of storage transistor 46 more negative. Note that cell 40 is capable of page or bulk erasing by the application of appropriate voltages to control gate 58 during erase.

Cell 40 may be read in two ways. Using the first option, approximately $V_{cc}$–2 V is applied to control gate 58, select gate 60 is grounded, and $V_{cc}$ is applied to source 50 and N-well 42. A read voltage $V_r$ less than $V_{cc}$ is applied to bit line BL. The current through cell 40 is dependent upon the threshold voltage $V_t$ of cell 40 and is thus indicative of the multi-bit data stored within cell 40. This read current is converted to a voltage and measured by voltage sense circuit 34. In a second option, bit line BL and N-well 42 are precharged to $V_{cc}$ and control gate 58, select gate 60, and source 50 are held at ground potential. Select transistor 48 is then turned on and the multi-bit data of cell 40 is detected by voltage sense circuit 34. Acceptable bias condition ranges for erasing, programming, and reading cell 40 are provided below in Table 1.

TABLE 1

| | Control Gate | Source | Bit line | Select Gate | N-well |
|---|---|---|---|---|---|
| program | 5–15 V or ramped from $V_{cc}$ to 15 V | 5–15 V | 0 V | 0 V | 5–15 V |
| erase option 1 | 0 for selected row; 8–10 V for unselect row | 15–22 V | Floating | 15–22 V | 15–22 V |
| erase option 2 | 0 for selected row; –15 to –3 V for unselected row | 3–15 V | Floating | 3–15 V | 3–15 V |
| read option 1 | 0–$V_{cc}$ | $V_{cc}$ | less than $V_{cc}$ | 0 | $V_{cc}$ |
| read option 2 | 0 | 0 | precharge to $V_{cc}$ | 0 | $V_{cc}$ |

Figure 1:
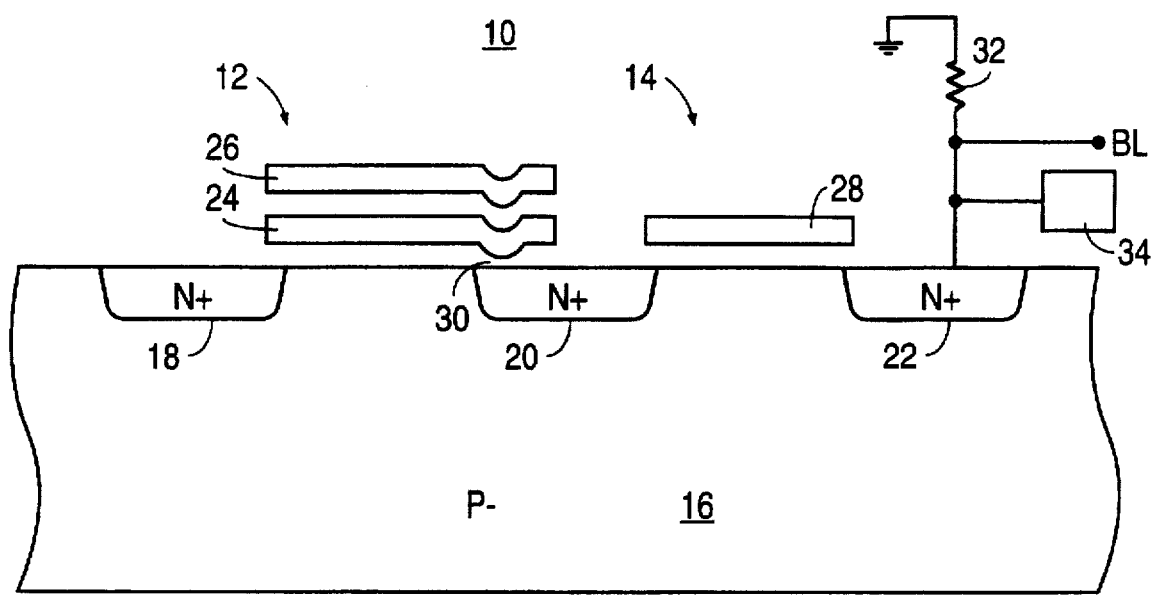
FIG. 1 is a cross-sectional view of a prior art EEPROM cell which may be programmed and erased to one of many levels of threshold voltage.

The resultant $V_t$ of storage transistor 46, and thus the current conducted by cell 40 during a subsequent read operation, may by controlled by manipulating the program voltage $V_p$. The injection of hot electrons, as discussed above with respect to charging floating gate 56, is affected only by the voltage applied to control gate 58 and is independent of variations in the thickness of oxide layer 62 and the coupling ratio between floating gate 56 and control gate 58. Further, PMOS devices conduct a gate current via hot electron injection over a narrow range of gate voltages. In this manner, the charging of floating gate 56 may be controlled with great accuracy. Precise control over the gate current, as well as the lack of dependence of cell 40's threshold voltage $V_t$ upon process parameters, thus advantageously allows the threshold voltage $V_t$ of storage transistor 46 to be more accurately controlled than that of conventional N-channel EEPROM cells such as cell 10 of FIG. 1.

Taking advantage of the superior control of the threshold voltage $V_t$ of storage transistor 46, the threshold voltage $V_t$ is accurately programmable in increments of only 5 mV. Since the range of threshold voltage $V_t$ for storage transistor 46 is approximately 7 V, the threshold voltage $V_t$ cell 10 may programmed to any one of approximately 1400 levels. Thus, cell 40 is capable of accurately storing up to 10 bits of binary data ($2^{10}$=1024).

As described above, the gate current controllability of a P-channel structure and the lack of dependence of hot electron injection upon process variations as discussed above not only allows cell 40 to store more bits of binary data but also does so with increased accuracy. Further, unlike conventional N-channel EEPROM cells, P-channel cell 40 does not require high voltage biases across its P+/N– junctions during programming and erasing. As a result, the size of cell 40 may be reduced to a greater extent than those of N-channel EEPROM cells without incurring destructive junction stress. Note that since whether or not charged floating gate 56 will be of a lower voltage than N-well 42, source 50, and drain 52, inadvertent hot electron injection during reading operations is prevented. In this manner, read disturb problems are eliminated from the operation of cell 40.

Figure 3:
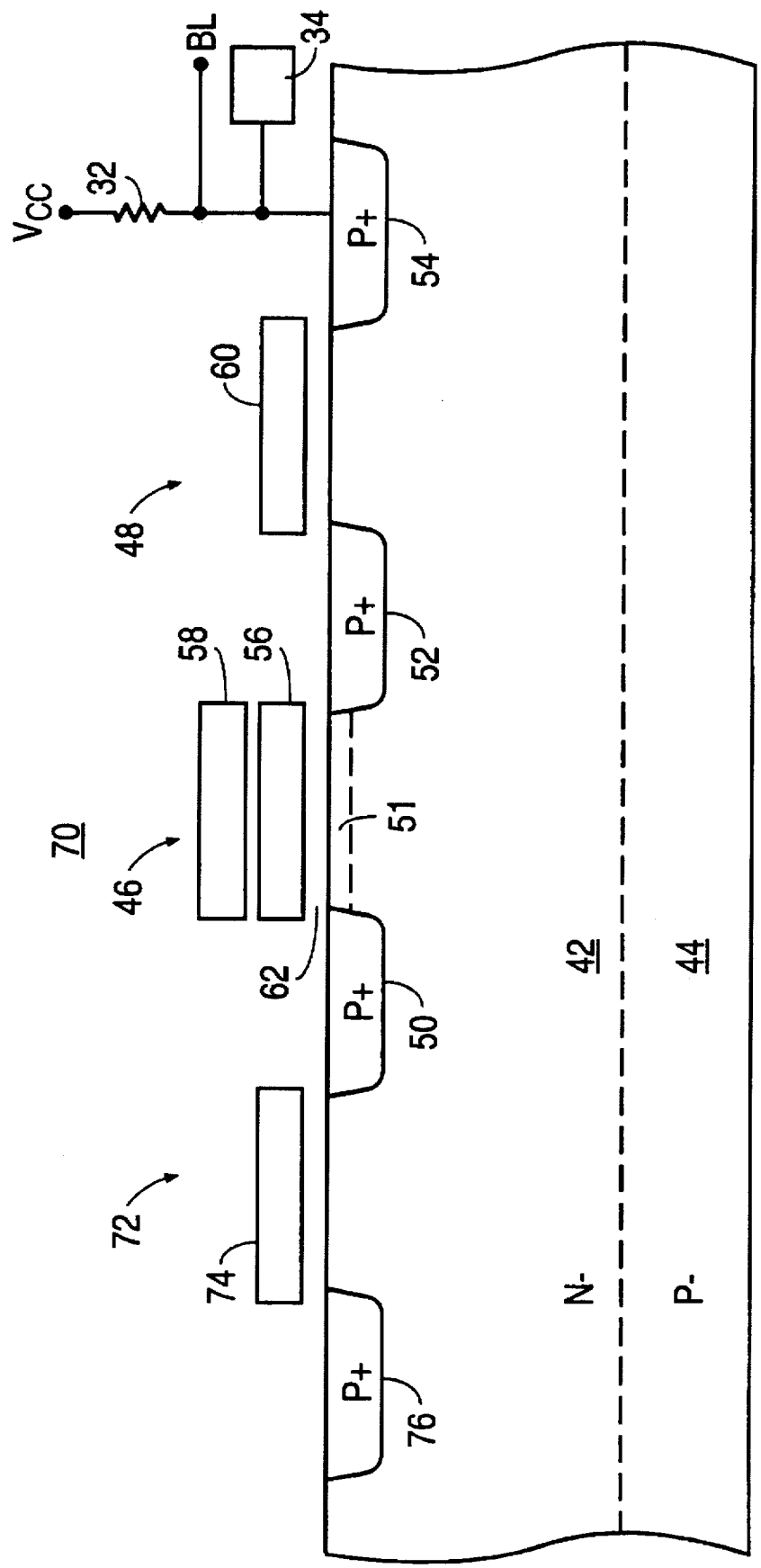
FIG. 3 is a cross-sectional view of the cell of FIG. 2 in accordance with another embodiment of the present invention.

In another embodiment shown in FIG. 3, a source select transistor 72 having a control gate 74 may be added to the structure of FIG. 2 to provide a bit-selectable erase cell 70. A P+ diffusion region 76 serves as the source of source select transistor 72, while P+ diffusion region 50 serves as the drain. The programming, erasing, and reading operations of cell 70, the bias conditions for which are listed below in Table 2, are similar to those described above with respect to FIG. 2. Note that when programming storage transistor 46 of cell 70, bit line BL is precharged to a voltage the precise value of which is dependent upon the threshold voltage $V_t$ of cell 70 after programming, as indicated by the "variable" notation in Table 2. Note that cell 70 may be programmed and erased bit-by-bit.

TABLE 2

|  | BL | BL select gate 60 | control gate 58 | source select gate 74 | 76 source | N-well |
|---|---|---|---|---|---|---|
| program option 1 | variable | 0 V | −15 to −3 V | 3–15 V | 3–15 V | 3–5 V |
| program option 2 | variable | 0 V | 0 V | 16–22 V | 16–22 V | 16–22 V |
| erase option 1 | 0 V | 0 V | 3–12 V | 0 V | 5–15 V | 5–15 V |
| erase option 2 | 0 V | 0 V | $V_{cc}$ ramped to 12 V | 0 V | 5–15 V | 5–15 V |
| read option 1 | less than $V_{cc}$ | 0 V | 0–$V_{cc}$ | 0 V | $V_{cc}$ | $V_{cc}$ |
| read option 2 | pre-charge to $V_{cc}$ then detect volatge | 0 V | 0 V | 0 V | 0 V | $V_{cc}$ |

Figure 4:
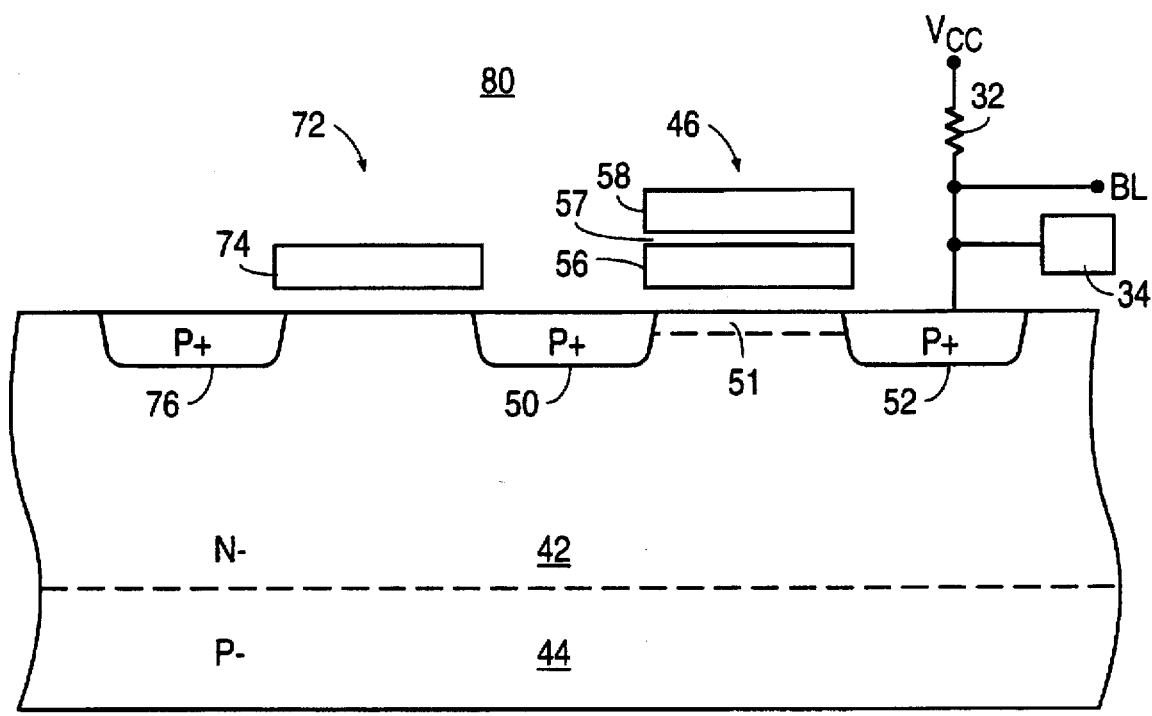
FIG. 4 is a cross-sectional view of the cell of FIG. 2 in accordance with yet another embodiment of the present invention.

In another embodiment shown in FIG. 4, cell 80 includes storage transistor 46 and source select transistor 72, where bit line BL is coupled directly to drain 52 of storage transistor 46. The programming, erasing, and reading operations of cell 80, the bias conditions for which are listed below in Table 3, are similar to those described above with respect to FIG. 2. Cell 80 is bit-programmable and may be sector erased. When programming cell 80, the resultant threshold voltage $V_t$ and thus the resultant multiple-bit data stored therein depends upon the particular program voltage $V_p$ applied to control gate 56. In a first option, e.g., option 1, the program voltage $V_p$ is ramped from approximately 3 V to its final value, while in a second option the variable program voltage $V_p$ is simply applied to control gate 56. Note that cell 80 may be column or bulk erased.

TABLE 3

|  | Bit Line BL | Control Gate | Select Gate | Source | N-well |
|---|---|---|---|---|---|
| program option 1 | 0 V | ramped (variable) | 0 V | 5–15 V | 5–15 V |
| program option 2 | 0 V | variable | 0 V | 5–15 V | 5–15 V |
| erase option 1 | 16–22 V for selected column; 8–12 V for unselected column | 0 V | 16–22 V | 16–22 V | 16–22 V |
| erase option 2 | 3–15 V for selected column; 0 V | −15 to −3 V | 3–15 V | 3–15 V | 3–15 V |

TABLE 3-continued

|  | Bit Line BL | Control Gate | Select Gate | Source | N-well |
|---|---|---|---|---|---|
| read option 1 | less than $V_{cc}$ for unselected column | 0 V–$V_{cc}$ | 0 V | $V_{cc}$ | $V_{cc}$ |
| read option 2 | precharge to $V_{cc}$ | 0 V | 0 V | 0 V | $V_{cc}$ |

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

I claim:

1. A semiconductor memory cell comprising:

an N-type well region formed in a substrate, said N-type well region having formed therein a P+ source, a P+ drain, and a channel region extending between said P+ source and said P+ drain;

a first insulating layer overlying said well region;

a floating gate overlying said first insulating layer;

a second insulating layer overlying said floating gate;

a control gate overlying said second insulating layer, said cell being programmed, in response to a program voltage applied to said control gate, by hot electron injection from a junction of said N-type well region and said P+ drain into said floating gate, the threshold voltage of said cell being programmable to any one of a plurality of program levels, said threshold voltage being determined by the magnitude of said program voltage; and a select transistor formed in said N-type well region, said select transistor having a P+ drain coupled to a bit line, a P+ source coupled to said P+ drain of said cell, and a bit line select gate, wherein said cell is programmed by applying said program voltage to said control gate, applying a first voltage to said P+ source of said cell and to said N-type well region while grounding said bit line and said bit line select gate, said program voltage being between 5 and 15 volts depending upon to which of said plurality of program levels it is desired to program said threshold voltage, said first voltage being between approximately 5 and 15 volts.

2. A semiconductor memory cell comprising:

an N-type well region formed in a substrate, said N-type well region having formed therein a P+ Source, a P+ drain, and a channel region extending between said P+ source and said P+ drain;

a first insulating layer overlying said well region;

a floating gate overlying said first insulating layer;

a second insulating layer overlying said floating gate;

a control gate overlying said second insulating layer, said cell being programmed, in response to a program voltage applied to said control gate, by hot electron injection from a junction of said N-type well region and said P+ drain into said floating gate, the threshold voltage of said cell being programmable to any one of a plurality of program levels, said threshold voltage being determined by the magnitude of said program voltage; and a select transistor formed in said N-type well region, said select transistor having a P+ drain coupled to a bit line, a P+ source coupled to said P+ drain of said cell, and a bit line select gate, wherein said cell is programmed by ramping said program voltage from a first voltage to a second voltage, applying between approximately 5 and 15 volts to said P+ source of said cell and to said N-type well region and applying a third voltage to said bit line select gate while grounding said bit line, said second voltage determining to which of said plurality of program levels said threshold voltage is to be programmed.

3. The structure of claim 2 wherein said first voltage is approximately 5 volts and said second voltage is approximately 15 volts.

4. A semiconductor memory cell comprising:

an N-type well region formed in a substrate, said N-type well region having formed therein a P+ source, a P+ drain, and a channel region extending between said P+ source and said P+ drain:

a first insulating layer overlying said well region;

a floating gate overlying said first insulating layer;

a second insulating layer overlying said floating gate;

a control gate overlying said second insulating layer, said cell being programmed, in response to a program voltage applied to said control gate, by hot electron injection from a junction of said N-type well region and said P+ drain into said floating gate, the threshold voltage of said cell being programmable to any one of a plurality of program levels, said threshold voltage being determined by the magnitude of said program voltage; and a select transistor formed in said N-type well region, said select transistor having a P+ drain coupled to a bit line, a P+ source coupled to said P+ drain of said cell, and a bit line select gate, wherein said cell is erased by applying between approximately 15 and 22 volts to said P+ source of said cell, to said bit line select gate, and to said N-type well region, while grounding said control gate and coupling said bit line to a floating potential.

5. A semiconductor memory cell comprising:

an N-type well region formed in a substrate, said N-type well region having formed therein a P+ source, a P+ drain, and a channel region extending between said P+ source and said P+ drain:

a first insulating layer overlying said well region;

a floating gate overlying said first insulating layer;

a second insulating layer overlying said floating gate;

a control gate overlying said second insulating layer, said cell being programmed, in response to a program voltage applied to said control gate, by hot electron injection from a junction of said N-type well region and said P+ drain into said floating gate, the threshold voltage of said cell being programmable to any one of a plurality of program levels, said threshold voltage being determined by the magnitude of said program voltage; and a select transistor formed in said N-type well region, said select transistor having a P+ drain coupled to a bit line, a P+ source coupled to said P+ drain of said cell, and a bit line select gate, wherein said cell is erased by applying between approximately 3 and 15 volts to said P+ source of said cell, to said bit line select gate, and to said N-type well region, while applying between approximately −3 and −15 volts to said control gate and coupling said bit line to a floating potential.

6. A semiconductor memory cell comprising:

an N-type well region formed in a substrate, said N-type well region having formed therein a P+ source, a P+ drain, and a channel region extending between said P+ source and said P+ drain;

a first insulating layer overlying said well region;

a floating gate overlying said first insulating layer;

a second insulating layer overlying said floating gate;

a control gate overlying said second insulating layer, said cell being programmed in response to a program voltage applied to said control gate, by hot electron injection from a junction of said N-type well region and said P+ drain into said floating gate, the threshold voltage of said cell being programmable to and one of a plurality of program levels, said threshold voltage being determined by the magnitude of said program voltage; and a select transistor formed in said N-type well region, said select transistor having a P+ drain coupled to a bit line, a P+ source coupled to said P+ drain of said cell, and a bit line select gate, wherein said bit line is coupled to a supply voltage, said cell being read by applying a voltage between approximately 0 volts and said supply voltage to said control gate, applying a first voltage to said P+ source of said cell and to said N-type well region, grounding said bit line select gate, and applying a second voltage to said bit line.

7. The structure of claim 6 wherein said first voltage is equal to approximately said supply voltage and said second voltage is less than said first voltage.

8. A semiconductor memory cell comprising:

an N-type well region formed in a substrate, said N-type well region having formed therein a P+ source, a P+ drain, and a channel region extending between said P+ source and said P+ drain;

a first insulating layer overlying said well region;

a floating gate overlying said first insulating layer;

a second insulating layer overlying said floating gate;

a control gate overlying said second insulating layer, said cell being programmed, in response to a program voltage applied to said control gate, by hot electron injection from a junction of said N-type well region and said P+ drain into said floating gate, the threshold voltage of said cell being programmable to any one of a plurality of program levels, said threshold voltage being determined by the magnitude of said program voltage; and a select transistor formed in said N-type well region, said select transistor having a P+ drain coupled to a bit line, a P+ source coupled to said P+ drain of said cell, and a bit line select gate, wherein said cell is read by setting said program voltage to ground potential, applying a first voltage to said N-type well region, pre-charging said bit line to said first voltage, and grounding said P+ source of said cell and said bit line select gate.

9. A semiconductor memory cell comprising:

an N-type well region formed in a substrate, said N-type well region having formed therein a P+ source, a P+ drain, and a channel region extending between said P+ source and said P+ drain;

a first insulating layer overlying said well region;

a floating gate overlying said first insulating layer;

a second insulating layer overlying said floating gate;

a control gate overlying said second insulating layer, said cell being programmed, in response to a program voltage applied to said control gate, by hot electron injection from a junction of said N-type well region and said P+ drain into said floating gate, the threshold voltage of said cell being programmable to any one of a plurality of program levels, said threshold voltage being determined by the magnitude of said program voltage;

a first select transistor formed in said N-type well region, said first select transistor having a P+ drain coupled to a bit line, a P+ source coupled to said P+ drain of said cell, and a bit line select gate; and a second select transistor formed in said N-type well region and having a P+ drain coupled to said P+ source of said cell and having a source select gate and a P+ source.

10. The structure of claim 9 wherein said cell is programmed by applying said program voltage to said control gate, applying between approximately 3 and 15 volts to said source select gate, to said P+ source of said second select transistor, and to said N-type well region while grounding said bit line select gate and applying a first voltage to said bit line.

11. The structure of claim 9 wherein said cell is programmed by applying between approximately 16 to 22 volts to said source select gate, to said P+ source of said second select transistor, and to said N-type well region while grounding said bit line select gate and said control gate and applying a first voltage to said bit line.

12. The structure of claim 9 wherein said cell is erased by applying between approximately 5 to 15 volts to said P+ source of said second select transistor and to said N-type well region, applying said program voltage to said control gate, and grounding said bit line, said source select gate, and said bit line select gate.

13. The structure of claim 9 wherein said cell is read by applying a first voltage to said P+ source of said second select transistor and to said N-type well region, applying said program voltage to said control gate, grounding said source select gate and said bit line select gate, and applying a second voltage, less than said first voltage, to said bit line.

14. The structure of claim 9 wherein said cell is read by applying a first voltage to said N-type well region, grounding said source select gate, said bit line select gate, said P+ source of said second select transistor, and said control gate, and pre-charging said bit line to a predetermined voltage.

* * * * *